(12) United States Patent
Veinot et al.

(10) Patent No.: US 8,323,731 B2
(45) Date of Patent: Dec. 4, 2012

(54) METHOD FOR PREPARING NANOCRYSTALLINE SILICON IN $SIO_2$ AND FREESTANDING SILICON NANOPARTICLES

(75) Inventors: Jonathan Gordon Conn Veinot, St. Albert (CA); Colin Michael Hessel, Edmonton (CA)

(73) Assignee: The Governors of the University of Alberta, Edmonton, Alberta (CA)

( * ) Notice: Subject to any disclaimer, the term of this patent is extended or adjusted under 35 U.S.C. 154(b) by 1200 days.

(21) Appl. No.: 11/915,427

(22) PCT Filed: May 26, 2006

(86) PCT No.: PCT/CA2006/000851
§ 371 (c)(1),
(2), (4) Date: May 30, 2008

(87) PCT Pub. No.: WO2006/125313
PCT Pub. Date: Nov. 30, 2006

(65) Prior Publication Data
US 2009/0117392 A1    May 7, 2009

Related U.S. Application Data

(60) Provisional application No. 60/684,987, filed on May 27, 2005.

(51) Int. Cl.
*B05D 3/02*    (2006.01)
(52) U.S. Cl. .................................................. 427/226
(58) Field of Classification Search .................. 427/226
See application file for complete search history.

(56) References Cited

U.S. PATENT DOCUMENTS

| | | | | |
|---|---|---|---|---|
| 5,145,723 A * | 9/1992 | Ballance et al. | | 427/397.7 |
| 5,614,603 A * | 3/1997 | Harkness et al. | | 528/14 |
| 6,319,797 B1 | 11/2001 | Usami | | |
| 6,387,824 B1 * | 5/2002 | Aoi | | 438/778 |
| 2003/0092240 A1* | 5/2003 | Kong et al. | | 438/404 |
| 2005/0207705 A1* | 9/2005 | Laurent-Lund | | 385/45 |
| 2006/0040103 A1* | 2/2006 | Whiteford et al. | | 428/403 |

FOREIGN PATENT DOCUMENTS

JP    2004359933    12/2004

OTHER PUBLICATIONS

Veprek et al., "Tungsten 'dye' induced fast blue/violet photoluminescence from nanocrystalline silicon-silica composite thin films," 1995, Appl. Phys. Lett. 67, pp. 2215-2217.*
Photopoulos et al., "Photo- and electroluminescence from nanocrystalline silicon single and multilayer structures," Mat. Sci. and Engr. B69-70, pp. 345-349, 2000.*
European Extended Search Report, dated Feb. 2, 2012, European Appln. No. 06741561.2, The Governors of the University of Alberta.
"Curing Study of Hydrogen Silsesquioxane Under H2/N2 Ambient", Huey-Chiang Liou et al., Mat. Res. Soc. Symp. Proc, vol. 612, 2000 Materials Research Society.

* cited by examiner

*Primary Examiner* — Michael Cleveland
*Assistant Examiner* — Robert Vetere
(74) *Attorney, Agent, or Firm* — Dinsmore & Shohl LLP

(57) ABSTRACT

Methods for preparing nanocrystalline-Si/SiO2 composites by treating hydrogen silsesquioxane (HSQ) under reductive thermal curing conditions are described. Also described are methods of preparing silicon nanoparticles by acid etching the nanocrystalline-Si/SiO2 composites.

20 Claims, 11 Drawing Sheets

A.

B.

A.

B.

METHOD FOR PREPARING NANOCRYSTALLINE SILICON IN SIO$_2$ AND FREESTANDING SILICON NANOPARTICLES

FIELD OF THE INVENTION

The present invention relates to methods of preparing nanocrystalline silicon embedded in SiO$_2$, in particular from a silsesquioxane precursor via reductive thermal curing. Further the present invention relates to the preparation of freestanding silicon nanoparticles by acid etching said nanocrystalline silicon embedded in SiO$_2$.

BACKGROUND OF THE INVENTION

Silicon nanostructures including porous silicon (p-Si),[1] silicon rich oxides (SROs),[2] and freestanding Si nanoparticles have been the focus of intense research because of their unique chemical and optical characteristics. The electronic structure of bulk silicon provides an indirect bandgap of 1.12 eV with the lowest point of the conduction band and the highest point in the valence band occurring at different coordinates in reciprocal space. These restraints make the bandgap optical transition dipole-forbidden, limiting practical optoelectronic application of the bulk crystal due to the low photoluminescence intensity and slow carrier dynamics (i.e., long lived excited states). As the dimensions of a semiconductor particle decrease into the "nano" size regime, the bandgap energy increases and pseudo-continuous bands become discrete energy levels that are populated according to quantum mechanical selection rules. When the particle dimension nears the Bohr exciton radius (ca. 5 nm for silicon), quantum confinement effects emerge and photoluminescence (PL) shifts into the visible spectrum and becomes more intense. Some researchers suggest that the PL observed from photoexcited Si nanoparticles arises because the bandgap transition becomes weakly dipole allowed in this size regime.[3] Others claim that the photoemission originates from the passivation of surface traps present in bulk Si.[4] Regardless of the explanation, a characteristic photoemission maximum at approximately 1.7 eV is seen for Si-based nanostructures; including the "Si quantum wires" reported by Canham et al.,[5] nanocrystalline nc-Si/SiO$_2$ composites,[2] and freestanding Si nanoparticles prepared via solution,[6,7,8] precursor pyrolysis,[9,10] and physical techniques.[11,12,13] The unique optical properties and electrochemical stability[14] of nanoscale elemental Si offer significant potential for a variety of light emission applications. Furthermore, the biocompatibility of Si and SiO$_2$ makes these materials potentially useful in sensing applications where toxic, electrochemically active compound semiconductor nanoparticles are impractical.

Measuring the direct effect of Si nanocrystal size on the PL spectrum of Si/SiO$_2$ nanocomposites and freestanding Si nanocrystals[9,10,13] appears complicated, with interface effects and particle interactions[15] playing key roles. Consequently, the size effects and the influence of the indirect bandgap of bulk Si on PL behavior of Si nanocrystals remain poorly understood. Methods for relating PL energy maximum to particle size are diverse and a variety of models have been proposed including: the effective mass approximation,[16] empirical tight binding band theory,[17,18] empirical pseudo-potential approximation,[19,20] and ab-initio local density approximation.[21,22] To facilitate better understanding of Si nanoparticle optical and chemical response, straightforward, cost-effective, scaleable methods for preparing materials of controlled size, crystal structure, and surface chemistry are necessary. Well-established physical techniques for preparing Si nanostructures such as porous silicon (p-Si) and silicon rich oxides (SRO) often employ highly corrosive reagents (e.g., hydrofluoric acid), costly procedures (e.g., ion implantation,[23,24] vacuum evaporation,[25] sputtering,[26] and laser ablation[27]) and provide only partial tailoring of film chemical composition. Furthermore, many of these methods are not easily scalable and are impractical for preparing macroscopic quantities (ca.>500 mg) of material.

SROs are a promising class of nanostructured materials made up of luminescent, crystalline Si nanoparticles embedded in environmentally inert SiO$_2$-like matrices. A common method for preparing SROs employs a multi-step process; the first stage involves deposition of thin "SiO" precursor films using physical methods such as vapor deposition, physical sputtering, or e-beam evaporation to deposit films onto flat substrates.[2] These recipe-based approaches control the Si:O ratio by maintaining a specific oxygen flow rate (i.e., partial pressure) during reactive deposition of "SiO" or by controlling the co-deposition rates of Si, "SiO", and SiO$_2$ to produce SiO$_x$ films ($0 \leq x \leq 2$).[28] Films are subsequently annealed at high temperature in a reducing atmosphere (typically 4% H$_2$, 96% inert gas) to promote formation of Si nanocrystals.[29] Iterative variation of experimental parameters and post deposition micro-probe analyses have previously shown that films with composition ratios close to Si$_{1.0}$O$_{1.5}$ that are annealed at ca. 1100° C. produce the strongest PL. Still, fundamental questions remain regarding the mechanism for nanoparticle formation, the relationship between Si particle size and peak PL energy, among others.[2] Unfortunately, the exact composition, structure, and purity of "SiO" is subject of a longstanding controversy[30,31,32] and is strongly dependent upon processing conditions.[30] Further, the exact chemical structure of "$^{Si}O_x$" remains largely ill-defined.[33] These uncertainties potentially hinder rational study of chemical composition and its influence on the material properties of SRO nanoparticle composites. Other practical limitations of the abovementioned physical "SiO$_x$" deposition techniques are nontrivial control of chemical composition (e.g., straightforward introduction of dopants), and conformal coverage of textured and "non-flat" substrates (e.g., fiber optic cables) is somewhat limited by these line-of-sight techniques.

Although SROs can be used to provide insight into the photonic, electronic, and chemical interactions of nc-Si within solid matrices, it is essential that these same properties be studied and understood for freestanding Si nanoparticles. This is particularly true if research is to move beyond fundamental investigation and efficient applications are to be realized. Studying the chemical reactivity and tunability of freestanding Si nanoparticles, in concert with single particle spectroscopy could lead to a better understanding and optimization of particle photoemission. To this end effective methods for preparing freestanding Si nanoparticles must be established. While freestanding particles have been dislodged from p-Si surfaces,[34] published data suggests individual Si nanoparticles remain trapped in larger (i.e., $\geq 1$ μm) pieces of the p-Si structure.[11,12,13] Similar liberation and bulk preparation of Si nanoparticles from SRO matrices is impractical given extremely small sample sizes.[35] Laser induced precursor pyrolysis has recently been reported as an efficient method for preparing large quantities of Si nanoparticles from silane at rates of 20-200 mg/hour; this approach however relies on expensive laser equipment and custom designed reactors not available in most synthetic laboratories.[9,10] Solution-based procedures,[8,36,37,38,39,40,41,42,43] provide some post synthesis material processability but are often plagued by material purity, ill-defined particle surface chemistry, and limited ambient stability—all criteria crucial to the eventual application of these materials in optoelectronic devices.

Silsesquioxanes are commercially available, solution processable, discrete, structurally well-defined molecules composed of silicon-oxygen frameworks with empirical formulae ($RSiO_{1.5}$) where R may be a variety of chemical functionalities (e.g., H, alkyl, silyl, and aromatic). The chemistry of these compounds is well-established and a variety of cage structures are known.[44] Hydrogen silsesquioxane (HSQ), a totally inorganic silsesquioxane ($H_8Si_8O_{12}$), is one of the most widely studied and has been investigated as a model silica surface,[45,46,47,48] luminescent material,[49] and a catalytic support.[50,51] Examples of high purity silica have also been prepared from silsesquioxane precursors.[52] It is generally accepted that upon oxidative thermal curing, the silsesquioxane cage structure of HSQ collapses to release $SiH_4$[53] and a $SiO_2$-like network solid forms whose dielectric,[54] mechanical, and processing characteristics depend on the curing conditions. Dielectric films produced by thermal curing of HSQ currently find application as spin-on, planarizing dielectric interlayers in the microchip industry.[54] To date, no Si nanoparticle preparation employing silsesquioxanes has been reported.

There remains a need for a method for preparing large quantities of Si nanoparticles that, ideally, is uncomplicated, cost-effective and reproducible.

SUMMARY OF THE INVENTION

Herein, the first application of hydrogen silsesquixane (HSQ) as a precursor to adherent, conformal, planarizing, photoluminescent nanocrystalline-$Si/SiO_2$ (nc-$Si/SiO_2$) composites via straightforward reductive thermal annealing is reported. Further photoluminescent, freestanding silicon nanocrystals were readily liberated from the nc-$Si/SiO_2$ composites upon etching.

Accordingly, the present invention relates to a method for preparing a nanocrystalline-$Si/SiO_2$ composite comprising curing a precursor comprising hydrogen silsesquixane (HSQ) under reductive thermal conditions for a time and at a temperature sufficient to produce a nanocrystalline-$Si/SiO_2$ composite.

In an embodiment of the present invention, the precursor comprising hydrogen silsesquixane (HSQ) is a film. Accordingly, the present invention also relates to a method for preparing a nanocrystalline-$Si/SiO_2$ composite film comprising:

(a) forming a film comprising hydrogen silsesquioxane; and (b) curing the film under reductive thermal conditions for a time and at a temperature sufficient to produce a nanocrystalline-$Si/SiO_2$ composite film.

The invention also includes nanocrystalline-$Si/SiO_2$ composites prepared using the method of the present invention as well as the use of such composites for the preparation of, for example, optoelectronic films and patterned films for incorporation into a variety of device structures, including, but not limited to, chemical sensors, optical amplifiers and waveguides.

The structural tunability of HSQ offers control over film composition and structure previously unattainable with status quo physical deposition methods.

The invention also includes a method for preparing photoluminescent silicon nanoparticles comprising acid etching the nanocrystalline-$Si/SiO_2$ composites prepared using the method described above under conditions effective to produce photoluminescent silicon nanoparticles.

Other features and advantages of the present invention will become apparent from the following detailed description. It should be understood, however, that the detailed description and the specific examples while indicating preferred embodiments of the invention are given by way of illustration only, since various changes and modifications within the spirit and scope of the invention will become apparent to those skilled in the art from this detailed description.

BRIEF DESCRIPTION OF THE DRAWINGS

The invention will now be described in relation to the drawings in which.

DETAILED DESCRIPTION OF THE INVENTION

Figure 1:
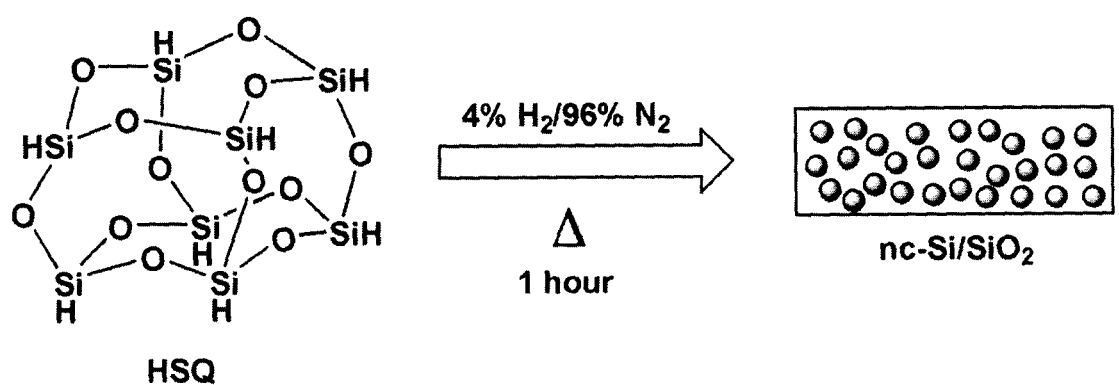
FIG. 1 is a schematic showing the thermal processing of hydrogen silsesquioxine (HSQ) for preparing silicon nanoparticle/$SiO_2$-like (nc-$Si/SiO_2$) nanocomposites.

A straightforward method for preparing adherent, conformal composites of nc-$Si/SiO_2$ that luminesce in the visible and near-IR regions of the spectrum is described. The composites may be formed from HSQ films or bulk samples. Thermal gravimetric analysis indicates that sample heating rate and processing atmosphere influence the weight loss arising from $SiH_4$ evolution. TEM, selected area electron diffraction, and X-ray powder diffraction confirm the presence of nc-Si likely produced from thermal decomposition of $SiH_4$ evolved during the rapid thermal processing of HSQ.

The well-defined molecular structure of HSQ offers excellent control and understanding of reaction conditions while also affording a straightforward method for producing macroscopic quantities of freestanding hydride terminated silicon nanocrystals. In addition, the solution processability, ease of handling, and chemical tunability of silsesquioxanes will facilitate the preparation of patterned optoelectronic films with tailored chemical response for incorporation into a variety of device structures including, chemical sensors, optical amplifiers, and waveguides.

Accordingly, the present invention relates to a method for preparing a nanocrystalline-$Si/SiO_2$ composite comprising curing a precursor comprising hydrogen silsesquixane (HSQ) under reductive thermal conditions for a time and at a temperature sufficient to produce a nanocrystalline-$Si/SiO_2$ composite.

The term "reductive thermal conditions" as used herein means in the presence of a gas comprising hydrogen, and suitably an inert gas such as helium, argon or nitrogen, or a mixture thereof. In an embodiment of the invention, the gas comprises about 2% to about 6% hydrogen and about 94% to about 98% nitrogen, suitably about 4% hydrogen and about 96% nitrogen.

The time and temperatures sufficient to produce a nanocrystalline-$Si/SiO_2$ composite may be determined by a person skilled in the art by varying the curing time and temperature until optimal production of a nanocrystalline-$Si/SiO_2$ composite is observed. The observation of nanocrystalline-$Si/SiO_2$ may be made using techniques known in the art, such as, for example, transition electron microscopy (TEM), selected area electron diffraction (SAED), X-ray diffraction (XRD) and photoluminescence spectroscopy. The photoluminescence maximum changes as the curing temperature changes. In an embodiment of the invention the reductive curing is carried out at temperatures in the range of about 900° C. to about 1200° C., suitably at about 1100° C., for about 30 minutes to about 2 hours, suitably for about 1 hour.

The precursor comprising HSQ may be in the form of a HSQ solution or in the form of a solid. When a solution is utilized, it is desirable that that HSQ solution be applied onto a substrate to form a film comprising HSQ. When the precursor is in the form of a solid, bulk nanocrystalline-$Si/SiO_2$ composites are prepared. The solid HSQ may be obtained, for example, by removing the solvent from a stock solution comprising HSQ.

The HSQ solution may be any suitable solution comprising HSQ and a carrier solvent. Such solutions are available, for example, from Dow Corning.[55] In an embodiment of the invention the solution comprises about 5% to about 20%, suitably about 10% HSQ, in a suitable solvent, such as methyl isobutyl ketone.

It is an embodiment of the invention that nanocrystalline-$Si/SiO_2$ composite is prepared as a film. Accordingly, the present invention relates to a method for preparing a nanocrystalline-$Si/SiO_2$ composite film comprising:

(a) forming a film comprising hydrogen silsesquioxane (HSQ); and (b) curing the film under reductive thermal conditions for a time and at a temperature sufficient to produce a nanocrystalline-$Si/SiO_2$ composite film.

In an embodiment of the invention, the HSQ film may be formed on a substrate using any known method, for example by spin coating a solution comprising HSQ onto the substrate. Spin coating the HSQ solution provides a film of uniform thickness on the substrate and allows the thickness of the film to be controlled by varying the spin rate. In an embodiment of the invention, about 0.1 ml to about 1.0 ml, suitably about 0.5 ml, of the HSQ solution is deposited onto the substrate and the substrate is spun from about 0 to about 7500 rpm, suitably from about 0 to about 5800 rpm, in about 3 seconds to about 10 seconds, suitably in about 5 seconds, followed by an additional spinning time of about 5 to about 60 seconds, suitably about 30 seconds, at about 4000 rpm to about 7000 rpm, suitably at about 6000 rpm. The substrate may be any inert substrate suitable for use in the methods of the invention. In an embodiment of the invention, the substrate is optical grade silica. Suitably the film is formed on the substrate in an inert environment.

The invention also includes nanocrystalline-$Si/SiO_2$ composites prepared using a method of the present invention as well as the use of such composites for the preparation of, for example, optoelectronic films and patterned films for incorporation into a variety of device structures, including, but not limited to, chemical sensors, optical amplifiers and waveguides.

The invention also includes a method for preparing photoluminescent silicon nanoparticles comprising acid etching the nanocrystalline-$Si/SiO_2$ composites prepared using a method described above under conditions effective to produce photoluminescent silicon nanoparticles.

The acid etching of the nanocrystalline-$Si/SiO_2$ composites may be carried out using any suitable acid, for example hydrofluoric acid, nitric acid or mixtures thereof. In an embodiment of the invention, the acid is hydrofluoric acid, suitably dilute HF.

Conditions effective to produce photoluminescent silicon nanoparticles include treating the nanocrystalline-$Si/SiO_2$ composite films with acid for about 2 minutes to about 30 minutes, suitably about 15-16 minutes, at temperatures in the range of about 20° C.-30° C.

The photoluminescence from the nanoparticles after etching can be stabilized significantly by chemical oxidization using, for example, $HNO_3$. The particles produce stable colloidal dispersions in diols and triols.

Thus, the present invention also includes a process for stabilizing photoluminescence of the silicon nanoparticles of the present invention by treating the photoluminescent silicon nanoparticles with an oxidizer under conditions effective to achieve particle surface oxidation.

Modification of the nanoparticle surfaces with organic compounds can also further stabilize the photoluminescence and make them dispersable in a wide range of solvents. Surface coating, such as attachment of organic molecules to hydrogen terminated and hydroxyl terminated surfaces of these nanoparticles has been shown to significantly stabilize the photoluminescence of the nanoparticles against degradation.

Thus, the present invention also includes a process for stabilizing photoluminescence of the silicon nanoparticles of the present invention that involves treating the photoluminescent silicon nanoparticles under conditions effective to produce photoluminescent silicon nanoparticles having an Si—H terminated surface, and then treating the Si—H surface-terminated nanoparticles under conditions effect to achieve particle surface hydrosilylation.

The present invention also includes a process for stabilizing photoluminescence of the silicon nanoparticles of the present invention that involves treating the photoluminescent silicon nanoparticles under conditions effective to produce photoluminescent silicon nanoparticles having an Si—OH terminated surface, and then treating the Si—OH surface-terminated nanoparticles under conditions effect to achieve particle surface silanization.

Silicon nanoparticles of the present invention may be used, for example, in full-colour displays, optical sensors, and fluorescent tags for biological imaging.

The following non-limiting examples are illustrative of the present invention:

EXAMPLES

Reagents and Materials.

HSQ was purchased from Dow Corning (tradename FOx-12®) as a 10 weight percent solution in methyl isobutyl ketone. This stock solution was used as received and stored in subdued light and inert atmosphere prior to use. Gold label methanol was purchased from Fisher scientific and freed of oxygen and trace water using a commercial Pure-Solv solvent system. Electronic grade hydrofluoric acid was purchased from J. T. Baker as a 49% aqueous solution and was used as received. Optical grade fused quartz was purchased from Esco Products. Prime-grade one-side-polished single-crystal Si substrates with no oxide back seal were purchased from Silicon Quest International.

Thin Film nc-Si/$SiO_2$ Composite Fabrication.

HSQ films were deposited onto substrates (for example optical grade silica from Esco Products, Si(111) and Si(100)) using a Laurell Technologies WS-400B-6NPP/LITE programmable spincoater in a nitrogen filled glovebox (<0.1 ppm $H_2O$; 0.6 ppm $O_2$). Colourless, uniform films were formed by dropping 0.5 ml of stock solution onto the substrate followed by spinning at 0-5800 rpm in 5 seconds, followed by an additional 30 seconds at 5800 rpm. Varying the maximum spin rate allows for straightforward thickness control of and precursor films. HSQ films were transferred in inert atmosphere to a high temperature furnace and annealed for one hour in 4% $H_2$ and 96% $N_2$. While in the furnace the samples remained on a cool stage until the desired temperature was reached. The stage was subsequently raised into the furnace "hot zone" where the sample was rapidly heated to peak temperature where it remained for 1 hour. Thicknesses of clear colourless precursor and coherent, light orange, annealed films on all substrates were determined using a Gaertner Multiangle Elispometer and are summarized in Table 1.

Bulk nc-Si/$SiO_2$ Composite Preparation and nc-Si Isolation.

Solvent was removed from the HSQ stock solution to yield a white, crystalline solid. The solid was placed in a quartz crucible and transferred in inert atmosphere to a high temperature furnace and annealed for one hour in a 4% $H_2$ and 96% $N_2$ atmosphere. As in the preparation of composite thin films, samples remained on a cool stage until the desired temperature was reached at which time the stage was then raised into the furnace "hot zone" where the sample remained for 1 hour. After cooling to room temperature, the amber solid sample was removed and mechanically ground in a mortar and pestle to yield a fine brown powder which was subsequently etched in 1:1:1 49% HF:$H_2O$: ethanol for 2 hours followed by repeated washing/centrifugation cycles in methanol. Yield: 4.8%

Thermogravametric Analysis.

Thermogravimetric analysis (TGA) was performed using a Perkin Elmer Pyris 1 TGA equipped with Pyris Thermal Analysis 7.0 software. Samples were placed in a Pt pan and heated in $N_2$ or 4% $H_2$:96% $N_2$ atmospheres from room temperature to 1100° C. at 10, 20, 50, 100° C./min.

Material Characterization and Instrumentation.

Optical absorption spectra of annealed films were measured using a Cary 6000i dual beam UV-vis-NIR spectrometer. Photoluminescence (PL) spectra were evaluated at room temperature using the 325 nm line of a He—Cd laser excitation source and emission was detected with a fiber-optic digital charge coupled device (CCD) spectrometer whose spectral response was normalized using a standard blackbody radiator. Fourier-transform infrared spectroscopy (FTIR) of thin film samples was performed using a Nicolet Magna 750 IR spectrophotometer. Transmission electron microscopy (TEM) and electron dispersive x-ray (EDX) analysis were preformed using a JEOL-2010 ($LaB_6$ filament) electron microscope with an accelerating voltage of 200 keV. Thin TEM samples were prepared by lifting off a piece of film with a razor blade and mounting it onto a copper grid with a 400 µm diameter hole. Samples were subsequently ion milled to perforation and images were obtained from the edge of the milled hole. TEM samples of the liberated, freestanding Si nanoparticles were dropcoated from a methanol suspension onto carbon coated copper grids. Bulk crystallinity of nc-Si/$SiO_2$ composites was evaluated using an INEL XRG 3000 x-ray diffractometer equipped with a Cu Kα radiation source.

Example 1

Thin film and Bulk nc-Si/$SiO_2$ Composite Preparation

Figure 2:
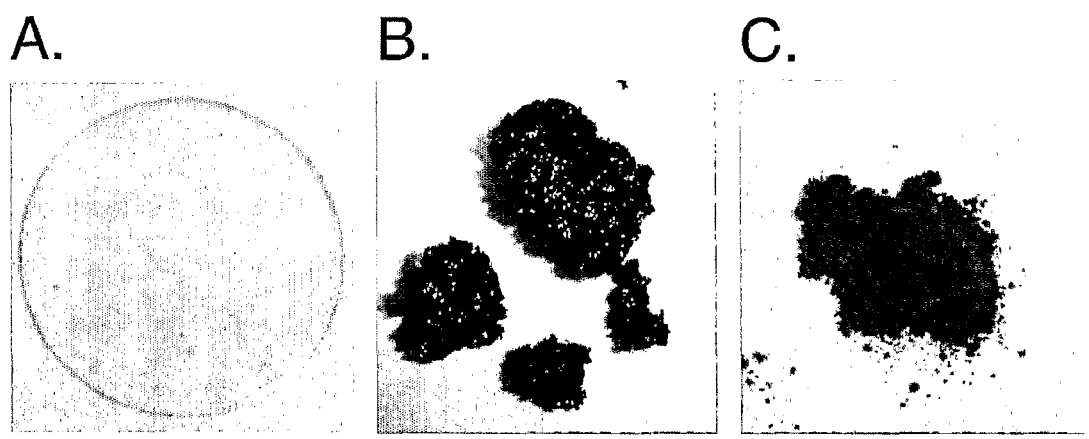
FIG. 2 shows photographs of A. optical grade silica substrate coated with a transparent nc-$Si/SiO_2$ film, B. bulk sample of reductively annealed HSQ, C. mechanically ground B.
Figure 3:
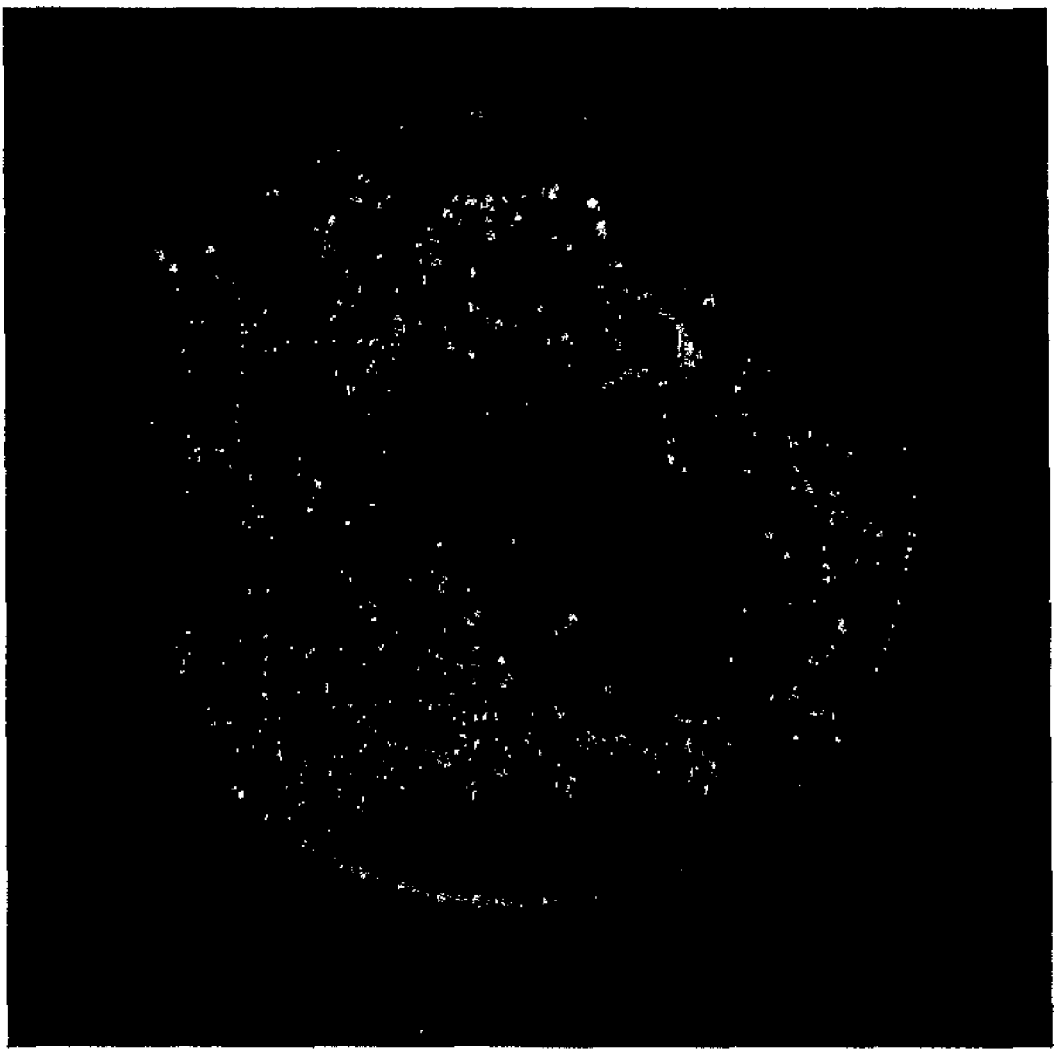
FIG. 3 shows orange/red photoluminescence from hydrofluoric acid liberated silicon nanocrystals upon exposure to a standard handheld ultraviolet light.

Hydrogen silsesquioxane was spincoated from a commercially available FOx-12® as a conformal, clear, colourless film that, upon reductive thermal processing in a 4% $H_2$:96%$N_2$ atmosphere, maintains its transparency, appears faint orange, is adherent (Scotch tape test) and resistant to abrasion (FIG. 1, FIG. 2). Reductive annealing of bulk quantities of white, crystalline HSQ using the aforementioned conditions for thin film thermal processing yields dark amber, glassy products that upon mechanical grinding yield orange/brown powders in near quantitative yield (FIG. 2B,C). TEM, SAED, XRD, and photoluminescence spectroscopy confirm thermal processing of thin film and bulk HSQ samples yield luminescent, diamond lattice, elemental silicon nanocrystallites encapsulated in a $SiO_2$-like matrix (vide infra). Embedded Si nanoparticles are readily liberated upon exposure of the nanocomposite to hydrofluoric acid which preferentially etches away the silicon oxide matrix leaving freestanding highly luminescent nc-Si.[56] (FIG. 3).

Example 2

Thermal Gravimetric Analysis

Figure 4:
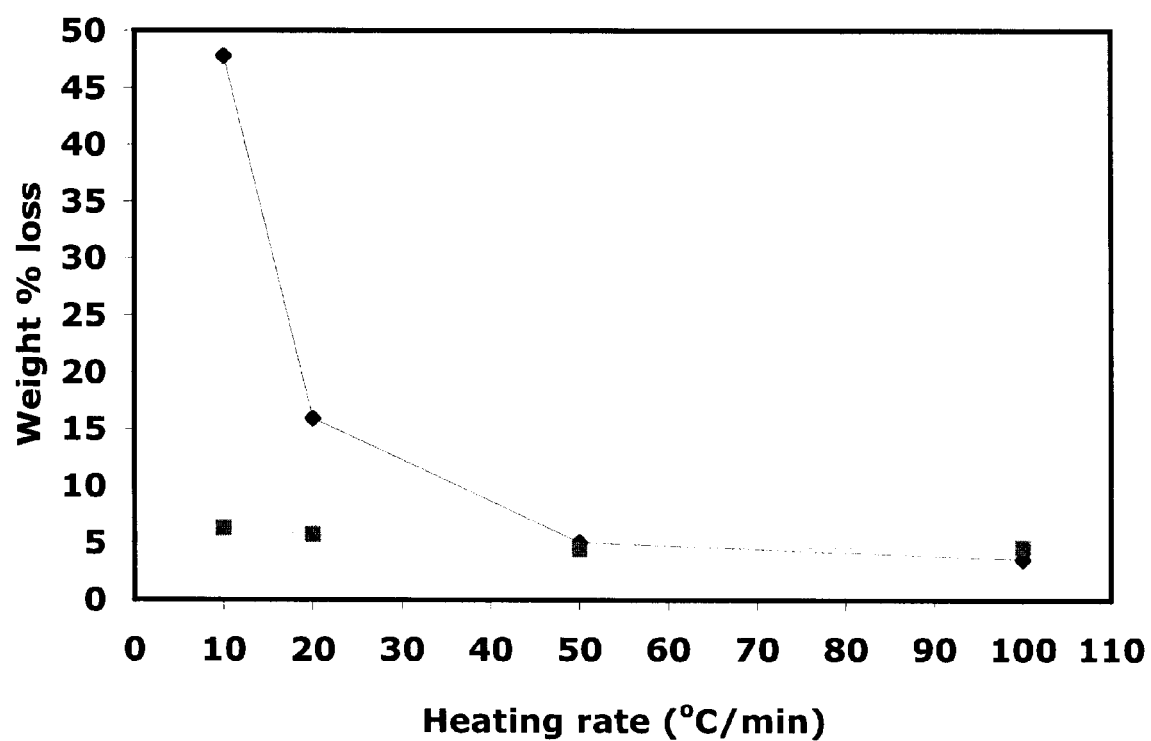
FIG. 4 is a graph showing the heating rate dependence of HSQ weight loss. Solid: nitrogen atmosphere. Dashed: 4% hydrogen:96%nitrogen atmosphere.

Thermal processing of neat HSQ samples was evaluated using thermal gravimetric analysis (TGA). In a nitrogen atmosphere, thermal traces of HSQ obtained at a heating rate of 10° C./min show four distinct regions of weight loss (ca. 50-225° C.; 1.8%, 225-375° C. ; 2.1%, ca. 375-425° C.; 0.8%, ca. 507° C.; 43%). With increased heating rate (i.e., 10, 20, 50, 100° C./min) a dramatic decrease (FIG. 4) in the observed weight loss at 507° C. (i.e., 10° C./min, 43% vs. 100° C./min, 5%) was noted. TGA analysis of HSQ in 4%$H_2$:96%$N_2$ shows ca. 5% weight loss regardless of heating rate.

Figure 5:
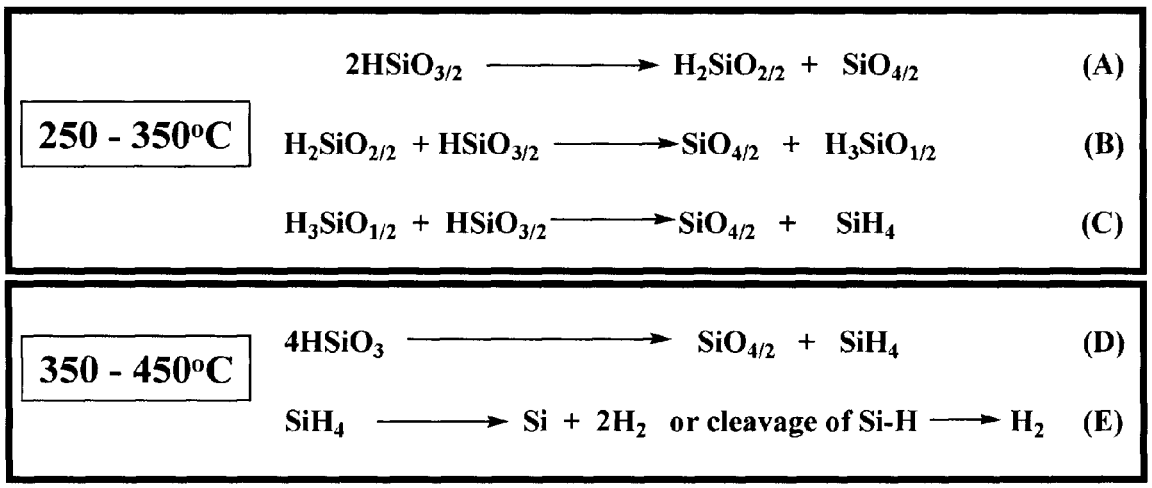
FIG. 5 shows the stages of HSQ thermal degradation in inert atmosphere.

The accepted stages of HSQ thermal processing in inert atmosphere (i.e., $N_2$ or Ar) are summarized in FIG. 5 and have previously been attributed to: i) trace solvent loss (<200° C.), ii) cage network redistribution with associated loss of $SiH_4$ (ca. 250-350° C.), iii) Si—H thermal dissociation accompanied by loss of $SiH_4$ and $H_2$ (350-450° C.), and iv) collapse of the pore structure (>450° C.). Detailed literature studies of HSQ thermal properties report on thermal processing of partially crosslinked HSQ gels and thin films, accounting for small differences in the present DSC temperature ranges.[57] The structures of low temperature (i.e., 250° C.-350° C.) thermally processed HSQ films have been studied spectroscopically, however the identity of any gas byproducts remains unknown. This is not the case for high temperature region of the TGA for which the loss of $SiH_4$ and $H_2$ has been confirmed by mass spectrometry.[58] Consistent with our nitrogen atmosphere TGA weight loss observations, Belot et al. noted a decrease in $SiH_4$ evolution and weight loss at 507° C. with increased heating rates and proposed that it might result from the rapid thermal decomposition of $SiH_4$ into silicon and hydrogen.[58] Herein, it was confirmed that the observed trend in weight loss at ca. 450° C. with increased heating rate is the result of the thermal decomposition of $SiH_4$ and the formation of Si. Upon rapid heating of HSQ (i.e., 250° C./min), thermally liberated $SiH_4$ is unable to escape the rapidly forming silicon oxide matrix prior to thermally decomposing. This process yields $SiO_2$ encapsulated Si nanocrystals (FIG. 5E). When thermally processed in a 4% $H_2$:96% $N_2$ atmosphere, HSQ loses a maximum of 6.3 wt. % for a heating rate of 10° C./min. While not wishing to be limited by theory, one possible explanation of the exact role of hydrogen in this processing atmosphere may be $H_2$-induced modifications to the HSQ decomposition mechanism (FIG. 5E). It is conceivable that low concentrations of $H_2$ in the thermal processing atmosphere limit, and may even prevent the dehydrogenation of HSQ thereby increasing the $SiH_4$ available for thermal decomposition.

Example 3

FT-IR Spectroscopy

Figure 6:
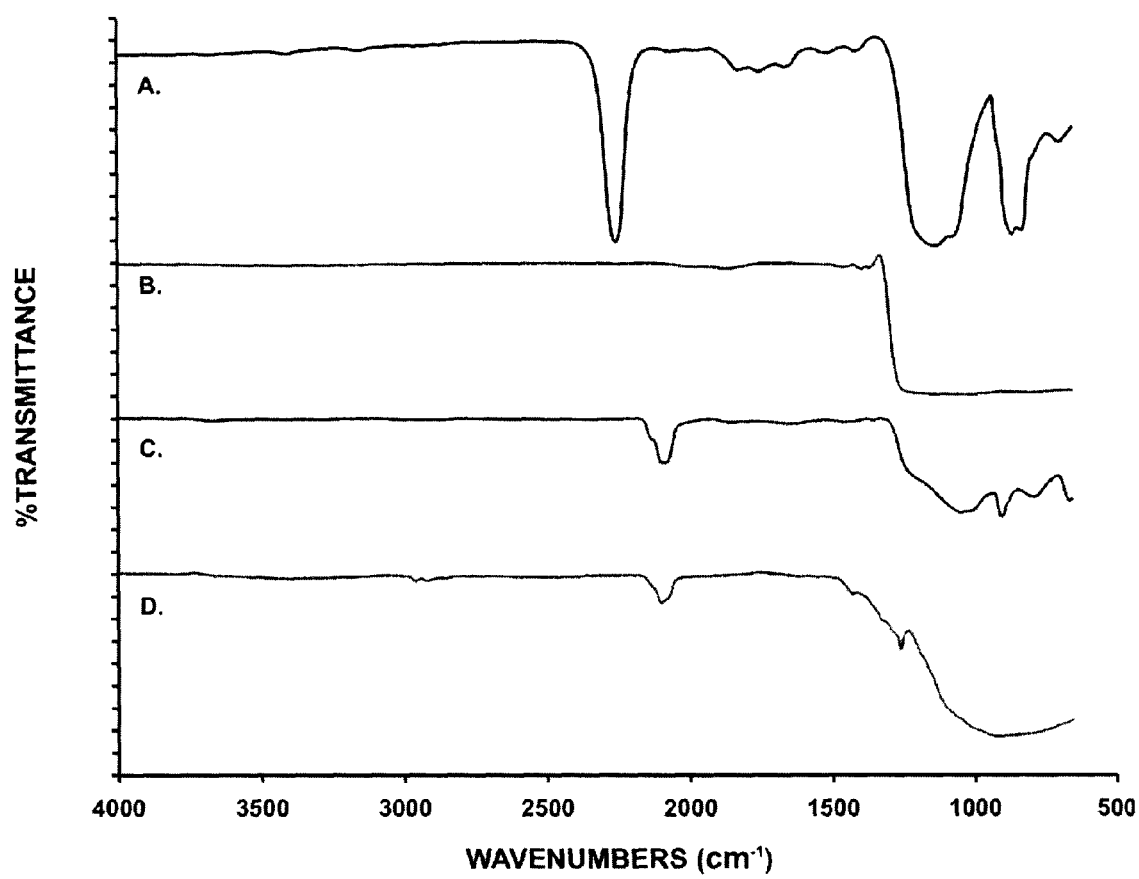
FIG. 6 shows infrared spectra of A. neat hydrogen silsesquioxine B. NEAT reductively annealed HSQ. HF etched annealed HSQ showing characteristic Si—H stretching (2100 $cm^{-1}$) and decreased Si—O—Si bending (1096 $cm^{-1}$). C. 60 min., D. 120 min.

FT-IR spectroscopy of NEAT HSQ shows a characteristic absorption at 2251 $cm^{-1}$ that is readily assigned to Si—H stretching (FIG. 6A). Absorptions are also noted in the range ca. 1300 to 800 $cm^{-1}$ and have previously been assigned to internal vibrations of the Si—O—Si cage framework.[59] Following reductive annealing (FIG. 6B) the absorption assigned to Si—H stretching disappears suggesting the HSQ molecules are crosslinked and the cage structure has collapsed. The replacement of broad HSQ Si—O—Si vibrations with a broad featureless absorption centered at ca. 1096 $cm^{-1}$, that was assigned to Si—O—Si bending in an $SiO_2$-like network, was also observed. FIG. 6C shows a typical FT-IR spectrum of partially etched nc-Si/$SiO_2$ powder following etching in 1:1:1 49% HF:$H_2O$: ethanol for 120 minutes. Characteristic Si—H, stretching at 2100 $cm^{-1}$ confirms particle hydride termination. In addition, a marked decrease in intensity of absorptions attributed to Si—O—Si vibrations at $\leq$1400 $cm^{-1}$ was noted with increased etching time. These vibrations are completely absent from the spectra of fully etched samples (FIG. 6D). Etching times to achieve complete removal of the $SiO_2$-like matrix depend on grinding efficiency of the composite material and the corresponding composite particle size.

Example 4

Absorption and Photoluminescence Spectroscopy

The UV-vis-NIR spectra of HSQ, a typical annealed HSQ film, and liberated Si nanoparticles provide limited information regarding the presence of nc-Si. The HSQ spectrum is featureless. In contrast, the spectra of a typical annealed thin film and suspended nc-Si/$SiO_2$ powder exhibit a low energy absorption onset at ca. 350 nm. Silicon nanocrystals typically have an absorption onset in the UV or blue, depending on the particle size.[2] Following etching, the UV-vis-NIR absorption spectrum of freestanding Si nanocrystals shows a low energy absorption onset at 350 nm.

Figure 7:
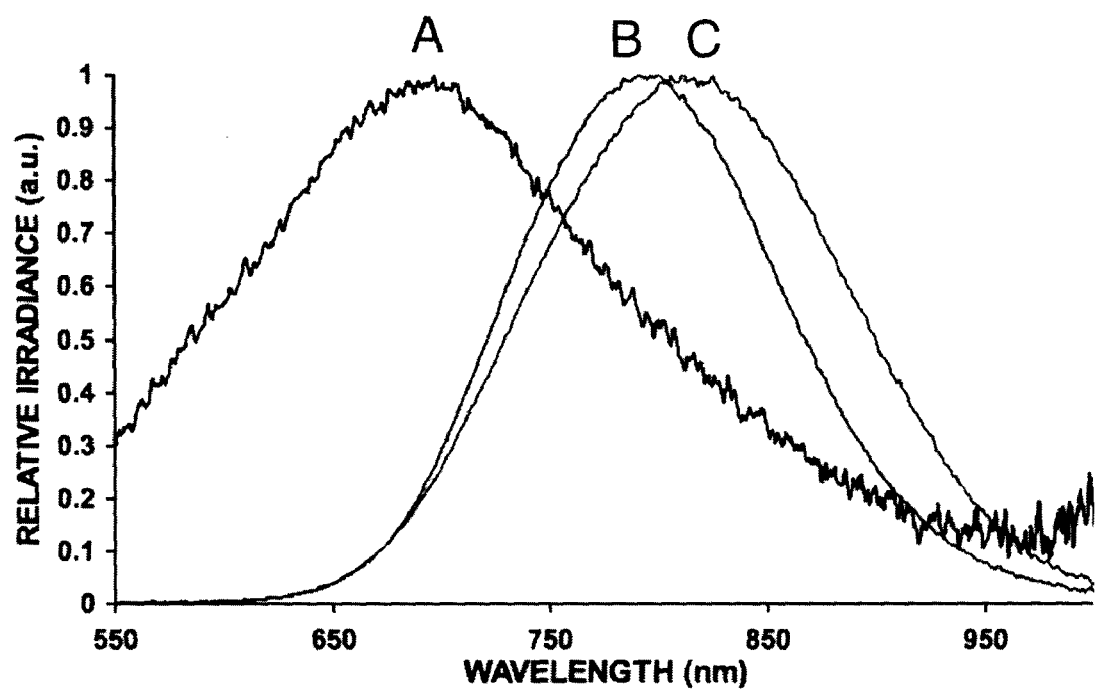
FIG. 7 shows normalized photoluminescence spectra of nc-$Si/SiO_2$ from HSQ processed at different temperatures: A: 900° C., B: 1000° C., C: 1100° C.

HSQ precursor films show no detectable photoluminescence. The influence of annealing temperature on the photoluminescent response of thermally processed HSQ films (thickness=140 nm) is significant (FIG. 7). Films processed at or below 700° C. in a 4% hydrogen atmosphere show no detectable visible photoluminescence at the limits of the instrumentation. When thin films of HSQ are annealed at 900° C., a weak PL emission emerges that is peaked at ~700 nm. As the annealing temperature was increased up to 1100° C., a trend toward lower energy emission was observed. Annealing at a maximum temperature of 1100° C. results in an intense PL emission centered at 810 nm that is characteristic of silicon nanocrystal films.

While not wishing to be limited by theory, the noted dependence of PL emission maximum on thermal processing temperature may be understood in the context of the known HSQ thermal decomposition processes and present TGA analyses (vide supra). Clearly, any $SiH_4$ evolved during slow heating escapes the oxide network and does not thermally decompose to produce nc-Si as seen in TGA heating profiles (i.e., 20, 50° C./min) and the PL characterization of thin film samples that are processed at or below 700° C. With increased processing temperature, the sample temperature increases more rapidly in the furnace hot zone and less $SiH_4$ escapes prior to decomposing; this is manifested in less weight loss and the appearance of visible photoluminesence. While the exact origin of the PL maximum for samples annealed at 900° C. is not completely clear, present TGA analysis suggests that not all evolved $SiH_4$ escapes when samples are heated at moderate rates (ca. 50° C./min). Previous studies of "$SiO_x$" films show the crystallization of Si nanocrystals occurs between 800 and 900° C.;[28] the photoluminesence of HSQ films annealed at 900° C. seems consistent with these observations. HSQ samples processed below 900° C. yield Si particles whose dimension are below the detection limits of standard TEM and XRD analyses. In this regard, a reasonable explanation for the observed low intensity, high-energy photoluminescence maxima for these films is the photoexcitation/emission of very small Si clusters arising from the thermal decomposition of small quantities of matrix trapped $SiH_4$. The observed shift to lower energy is easily understood in the context of larger particles that form after annealing at higher temperatures.

Figure 8:
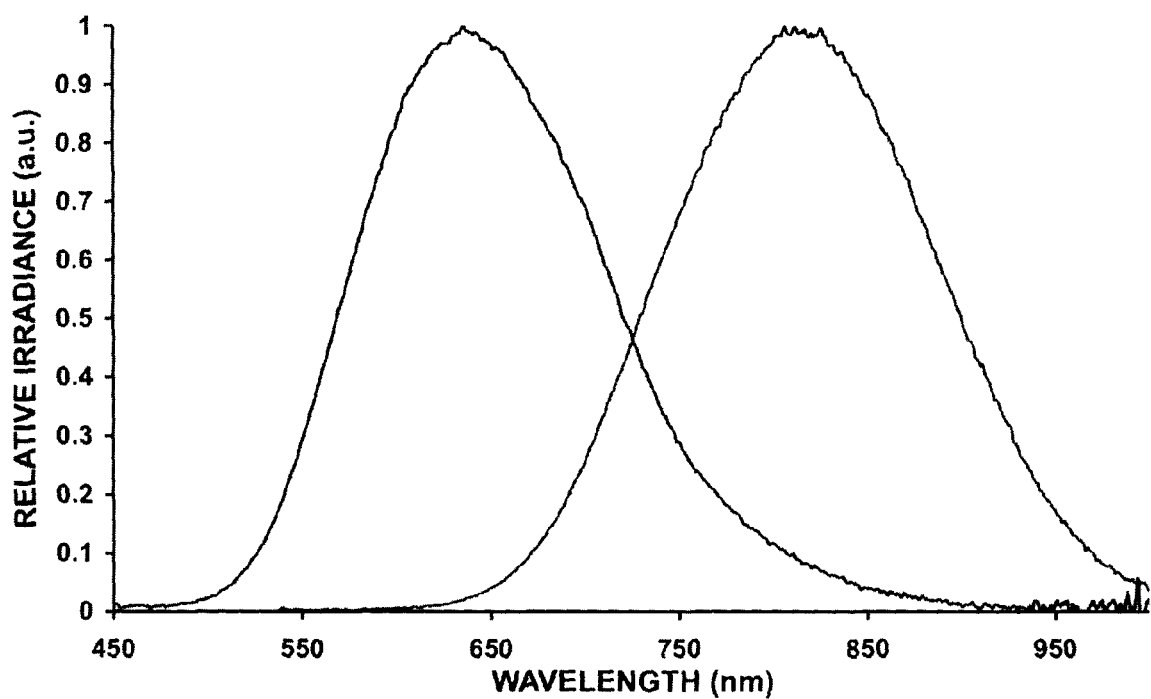
FIG. 8 shows typical normalized photoluminescence spectrum of nc-$Si/SiO_2$ A. bulk material, B. HF liberated hydride surface terminated nc-Si.

Photoluminescence characterization of methanol suspensions of highly luminescent HF liberated Si nanoparticles (d=2.1±0.3 nm) with a peak PL emission at 640 nm is shown in FIG. 8B. The observed blue shift in PL maximum upon exposure to HF is consistent with previous reports for etched nc-Si/$SiO_2$ nanocomposites.[35]

Example 5

Transmission Electron Microscopy, EDX and SAED

Figure 9:
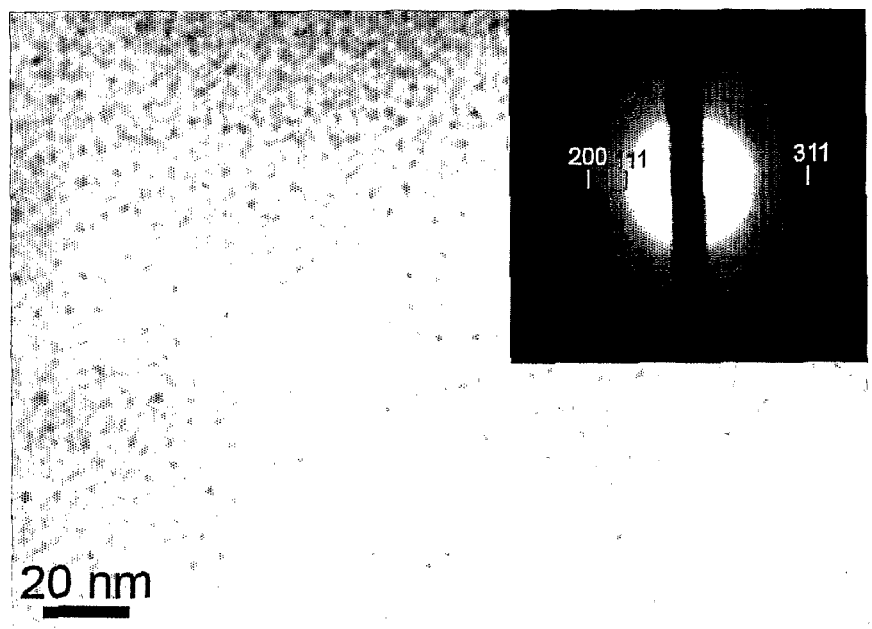
FIG. 9 shows A. A brightfield transmission electron micrograph of 2.27±0.59 nm nc-Si in $SiO_2$. (inset: Selected area electron diffraction of nc-$Si/SiO_2$ thin film composite showing {111}, {200}, and {311}, reflections characteristics of diamond lattice Si.) B. Size distribution of Si nanocrystals, n=115.
Figure 9:
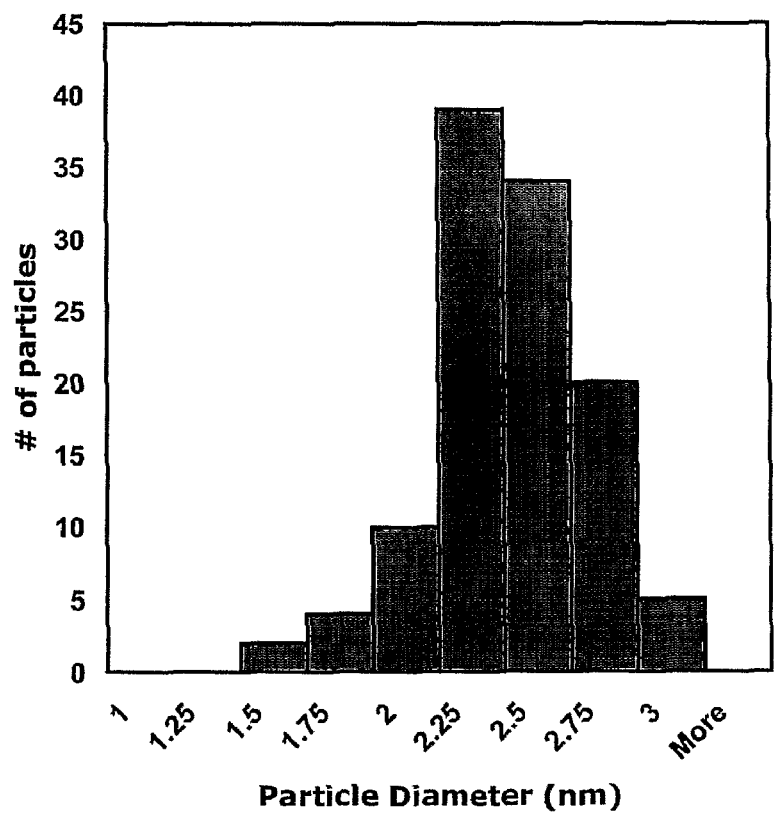
Figure 10:
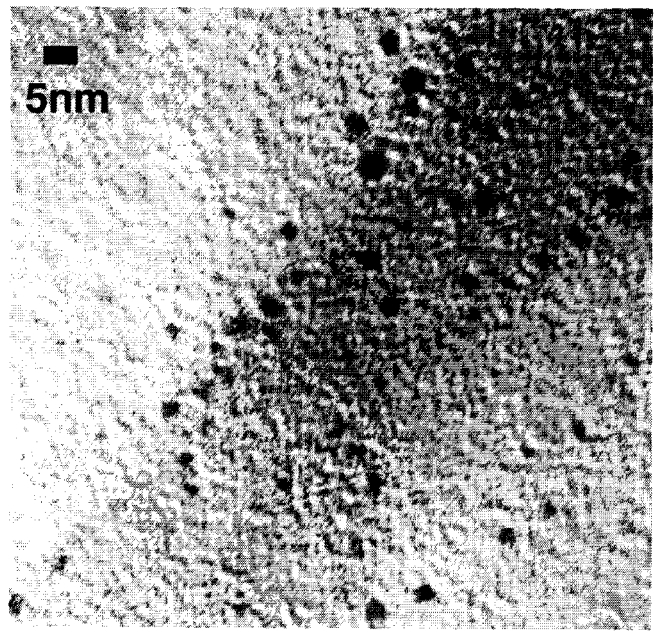
FIG. 10 shows A. Transmission electron micrograph of 2.1±0.3 nm Si nanocrystals liberated via HF etching from nc-$Si/SiO_2$. B. Size distribution of liberated hydride surface terminated Si nanocrystals, $d_{avg}$=2.11, 2σ=0.82, n=50 particles.
Figure 10:
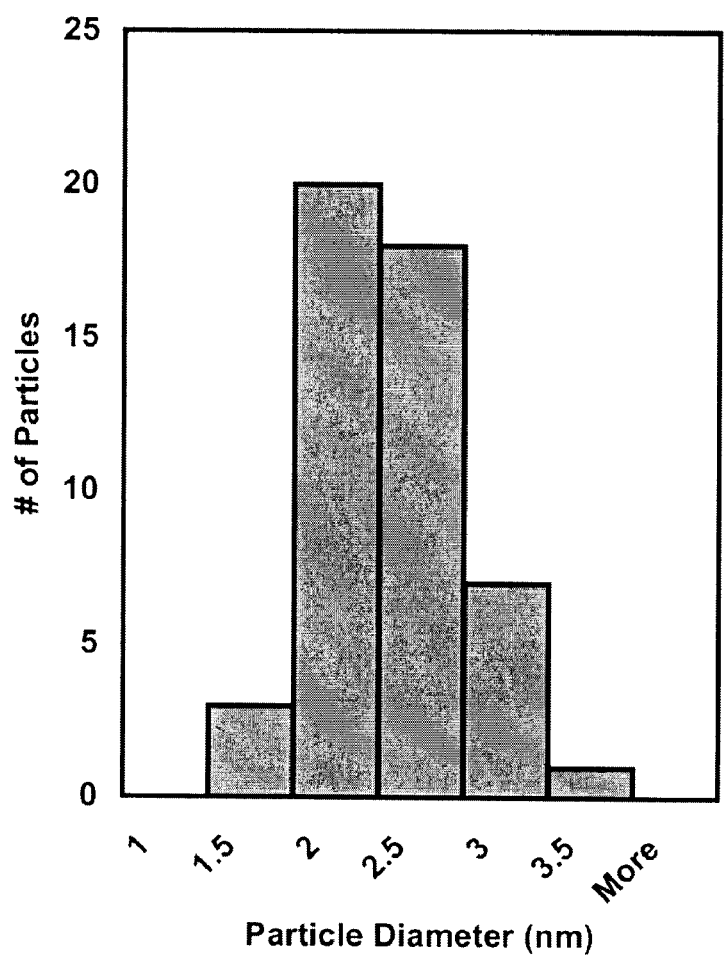

FIG. 9A shows a representative bright field TEM image of a thin film annealed at 1100° C., showing irregular nc-Si particles with an average diameter 2.27 nm ($2\sigma$=0.59 nm; n=115) (FIG. 9C). Silicon nanoparticles are clearly uniformly distributed throughout the film (FIG. 9A). EDX analysis confirms the presence of only Si and O. Selected area electron diffraction (FIG. 9A, inset) shows the particles are crystalline and have the characteristic diamond lattice of silicon. TEM analysis of HF-liberated nc-Si dropcoated from methanol suspensions onto a carbon-coated grid shows discrete Si nanoparticles with diameters of d=2.11 nm (2σ=0.82 nm; n=50) (FIG. 10). This apparent decrease in particle size and broadening of the size distribution is likely the result of limited particle etching and size selective precipitation by which large particles are removed and only the smallest particles remain suspended in the solvent throughout the etching process. (Note: the apparent error is more than the difference in the sizes) Selected area electron diffraction confirms particles to be diamond lattice Si with the {111}, {200}, and {311} reflections are visible.

Example 6

X-Ray Powder Diffraction

Figure 11:
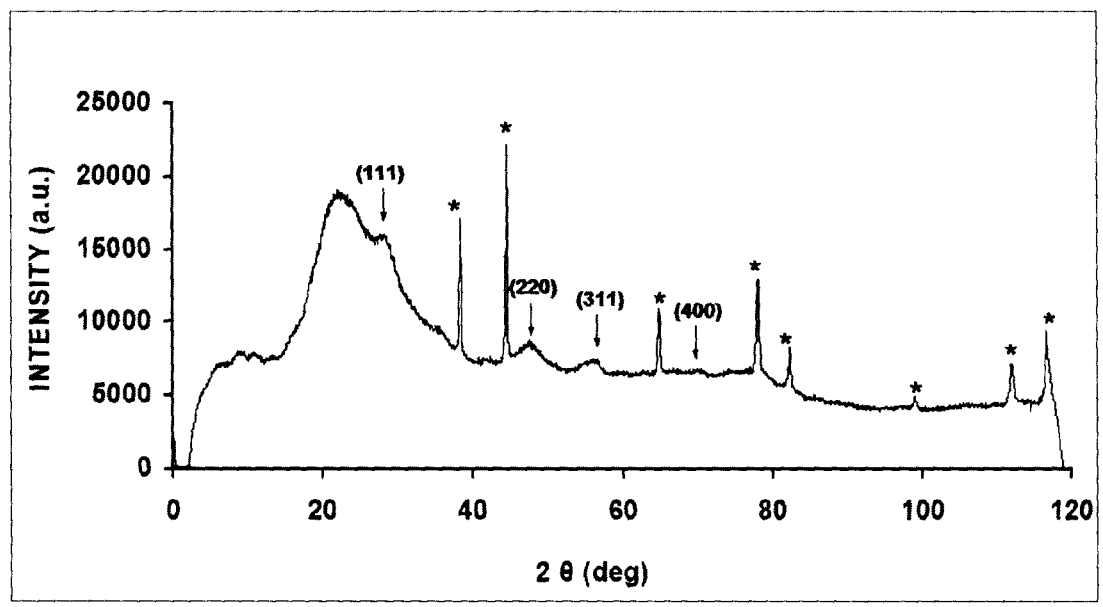
FIG. 11 shows an X-ray powder diffraction of mechanically ground, thermally processed HSQ. Noted reflections are consistent with diamond lattice silicon
(* are reflections arising from the aluminum sample holder).

The crystallinity of the $SiO_2$-embedded Si nanoparticles was evaluated by x-ray powder diffraction (XRD) using Cu $K_z$ radiation source (FIG. 11). The positions and intensities of all broadened reflections agree with selected area electron diffraction noted for the abovementioned thin film analogues and are consistent with a diamond lattice Si.

While the present invention has been described with reference to what are presently considered to be the preferred examples, it is to be understood that the invention is not limited to the disclosed examples. To the contrary, the invention is intended to cover various modifications and equivalent arrangements included within the spirit and scope of the appended claims.

All publications, patents and patent applications are herein incorporated by reference in their entirety to the same extent as if each individual publication, patent or patent application was specifically and individually indicated to be incorporated by reference in its entirety. Where a term in the present application is found to be defined differently in a document incorporated herein by reference, the definition provided herein is to serve as the definition for the term.

TABLE 1

| Substrate | Maximum Spin Rate (RPM) | HSQ Thickness (Å)$^a$ | nc-Si/$SiO_2$ Thickness (Å)$^a$ |
|---|---|---|---|
| Optical grade $SiO_2$ | 5800 | 1393 | 923 |
| Si(111) | 5800 | 1620 | 1553 |
| Si(100) | 5800 | 1617 | 1524 |

$^a$Film thicknesses were determined using $\eta_{Si}$ = 3.85, $\eta_{SiO2}$ = 1.46, and $\eta_{film}$ = 1.41.

FULL CITATIONS FOR DOCUMENTS REFERRED TO IN THE SPECIFICATION

[1] Buriak, J. M. *Chem. Rev.* 2002, 102, 1271.
[2] Meldrum, A. *Resent Res. Devel. Nuclear Phys.* 2004, 1, 93.
[3] Takagahara, T.; Takeda, K. *Phys. Rev. B* 1992, 46, 15578.
[4] Klimov, V. I.; Schwarz, C. J.; McBranch, D. W.; White, C. W. *Appl. Phys. Lett.* 1998, 73, 2603.
[5] Canham, L. T. *Appl. Phys. Lett.* 1990, 57, 1046.
[6] Baldwin, R. K.; Pettigrew, K. A.; Garno, J. C.; Power, P. P.; Liu, G. -Y.; Kauzlarich, S. M. *J. Am. Chem. Soc.* 2002, 124, 1150.
[7] Pettigrew, K.; Liu, Q.; Power, P. P.; Kauzlarich, S. M. *Chem. Mater.* 2003, 15, 4005.
[8] Rowsell, B. D.; Veinot, J. G. C. *Nanotechnology* 2005, 16, 732.
[9] Li, X. G.; He, Y. Q.; Swihart, M. T. *Langmuir* 2004, 20, 4720.
[10] Li, X. G.; He, Y. Q.; Talukdar, S. S.; Swihart, M. T. *Langmuir* 2003, 19, 8490.
[11] Nayfeh, M. H.; Barry, N.; Therrien, J.; Akcakir, O.; Gratton, E.; Belomoin, G. *Appl. Phys. Lett.* 2001, 78, 1131.
[12] Nayfeh, M. H.; Akcakir, O.; Belomoin, G.; Barry, N.; Therrien, J.; Gratton, E. *Appl. Phys. Lett.* 2000, 77, 4086.
[13] Belomoin, G.; Therrien, J.; Smith, A.; Rao, S.; Twesten, R.; Chaleb, S.; Nayfeh, M. H.; Wagner, L.; Mitas, L. *Appl. Phys. Lett.* 2002, 80, 841.
[14] Ding, Z.; Quinn, B. M.; Haram, S. K.; Pell, L. E.; Korgel, B. A.; Bard, A. J. *Science* 2002, 296, 1293.
[16] Breitenecker, M.; Sexl, R.; Thirring ,W. *Zeit. Physik* 1964, 182, 123.
[17] Hill, N. A.; Whaley, K. B. *J. Electron. Mater.* 1996, 25, 269.
[18] Hill, N. A.; Whaley, K. B. *Phys. Rev. Lett.* 1995, 75, 1130.
[19] Wang, L. W.; Zunger, A. *J. Phys. Chem.* 1994, 98, 2158.
[20] Delerue, C.; Allan, G.; Lannoo, M. *Phys. Rev. B* 1993, 48, 11024.
[21] Delerue, C.; Allan, G.; Lannoo, M. *J. Lumines.* 1998, 80, 65.
[22] Ogut, S.; Chelikowsky, J. R.; Louie, S. G. *Phys. Rev. Lett.* 1997, 79, 1770.
[23] Shimizu-lwayama, T.; Ohshima, M.; Niimi, T.; Nakao, S.; Saitoh, K.; Fujita, T.; Itoh, N. *J. Phys.:Condens. Matter* 1993, 5, L375.
[24] Meldrum, A.; Haglund, R. F.; Boatner, L. A.; White, C. W. *Adv. Mater.* 2001, 13, 1431.
[25] Kahler, U.; Hofmeister, H.; *Opt. Mater.* 2001, 17, 83.
[26] Gorbilleau, F.; Portier, X.; Ternon, C.; Voivenel, P.; Madelon, R.; Riszk, R. *Appl. Phys. Lett.* 2001, 78, 3058.
[27] Orii, T.; Hirasawa, M.; Seto, T. *Appl. Phys. Lett.* 2003, 83, 3395.
[28] A. Meldrum, A. Hryciw, A. N. MacDonald, C. Blois, K. Marsh, J. Wang, and Q. Li, *J. Vac. Sci. Tech. (in press)*.
[29] Neufeld, E.; Wang, S.; Aptez, R.; Buchal, Ch.; Carius, R.; White, C. W.; Thomas, D. K. *Thin Sol. Films* 1997, 294, 238.
[30] Holhl, A.; Weider, T.; van Aken, P. A.; Weirich, T. E.; Denninger, G.; Vidal, M.; Oswald, S.; Deneke, C.; Mayer, J.; Fuess, H. *J. Non-Cryst. Sol.* 2003, 320, 255. and references therein.
[31] Schulmeister, K.; Mader, W. *J. Non-Cryst. Sol.* 2003, 320, 143.
[32] Commercially available "SiO" is an orange/brown/black solid, however SiO is reported to be a white, crystalline (cub.) solid with m.p. >1702° C. See: *Handbook of Chemistry and Physics* 73$^{rd}$ Edition, D. R. Linde Editor, CRC Press, Boca Raton, Fla., 1997.
[33] "$SO_x$" is viewed as a kinetically inert, amorphous material that converts to the thermodynamically favored nanocrystalline Si and $SiO_2$ upon thermal processing. See ref. 30.
[34] Valenta, J.; Janda, P.; Dohnalova, K.; Niznansky, D.; Vacha, F.; Linnros, J. *Opt. Mat.* 2005, 27, 1046.
[35] Recently bulk thermolysis of "$SiO_x$" was reported however no yield was provided. See: Liu, S. M.; Sato, S.; Kimura, K. *Langmuir* 2005, 21, 6324.
[36] Heath, J. R.; Shiang, J. J.; Alivisatos, A. P. *J. Chem. Phys.* 1994, 101, 1607.
[37] Baldwin, R. K.; Pettigrew, K. A.; Garno, J. C.; Power, P. P.; Liu, G. Y.; Kauzlarich, S. M. *J. Am. Chem. Soc.* 2002, 124, 1150.
[38] Zou, J.; Baldwin, R. K.; Pettigrew, K. A.; Kauzlarich, S. M. *Nanolett.* 2004, 7, 1181.
[39] Pettigrew, K. A.; Liu, Q.; Power, P. P.; Kauziarich, S. M. *Chem. Mat.* 2003, 15, 4005.
[40] Liu, Q.; Kauziarich, S. M. *Mat. Sci. and Eng. B* 2002, 96, 72.

[41] Mayeri D, Phillips B L, Augustine M P, Kauzlarich S M *Chem. Mater,* 2001, 13, 765.
[42] Baldwin, R. K.; Pettigrew, K. A.; Ratai, E.; Augustine, M. P.; Kauzlarich, S. M. *Chem. Comm.* 2002, 17, 1822.
[43] Wilcoxon, J. P.; Provencio, P. P.; Samara, G. A. *Phys. Rev. B* 1999, 60, 2704.
[44] Brook, M. B. *Silicon in Organic, Organometallic, and Polymer Chemistry,* John Wiley and Sons, Inc.: New York, N.Y., 2000.
[45] Feher, F. J.; Budzichowski, T. A.; Blanski, R. L.; Weller, K. J.; Ziller, J. W. *Organometallics* 1991, 10, 2526.
[46] Feher, F.; Newman, D. A. *J. Am. Chem. Soc.* 1990, 112, 1931.
[47] Feher, F.; Newman, D. A.; Walzer, J. F. *J. Am. Chem. Soc.* 1989, 111, 1741.
[48] Feher, F. J.; Budzichowski, T. A.; Rahimian, K.; Ziller, J. W. *J. Am. Chem. Soc.* 1992, 114, 3859.
[49] Azinovic, D.; Cai, J.; Eggs, C.; Konig, H.; Marsmann, H. C.; Veprek, S. *J. Lumines.* 2002, 97, 40.
[50] Tour, J. M.; Pendalwar, S. L.; Cooper, J. P. *Chem. Mat.* 1990, 2, 647.
[51] Brook, M. A.; Ketelson, H. A. M.; Pelton, R. H.; Heng, Y.-M. *Chem. Mat* 1996, 8, 2195.
[52] Arkles, B.; Berry, D. H.; Figge, L. K.; Composto, R. J.; Chiou, T.; Colazzo, H.; Wallace, W. E. *Sol-Gel Sci. Tech.* 1997, 8, 465.
[53] Yang, C., -C.; Chen, W. -C. *J. Mat. Chem.* 2002, 12, 1138.
[54] Hummel, J.; Endo, K.; Lee, W. W.; Mills, M.; Wang, S. Q. *Low-Dielectric Constant Materials V*, The Materials Research Society, Warrendale, Pa., 1999, vol. 565.
[55] http://www.dowcorning.com/content/etronics/etronicsspin/etronics_spin_imo v.asp.
[56] Williams, K. R. *Journal of Microelectromechanical Systems,* 1996, 5, No. 4.
[57] Detailed literature studies of HSQ thermal properties report on thermal processing of partially crosslinked HSQ gels and thin films, accounting for small differences in the present DSC temperature ranges. See: Yang, C., -C.; Chen, W., -C. *J. Mat. Chem.* 2002, 12, 1138.
[58] Belot, V.; Corriu, R.; Leclecq, D.; Mutin, P. H.; Vious, A. *Chem. Mat.* 1991, 3, 127.
[59] Albrecht, M. G.; Blanchette, C. *J. Electrochem. Soc.* 1998, 145, 4019.

We claim:

1. A method for preparing a nanocrystalline-Si/$SiO_2$ composite comprising curing a precursor comprising hydrogen silsesquioxane (HSQ) under reductive thermal conditions in the presence of a gas containing hydrogen for about 30 minutes to about 2 hours and at a temperature in the range of about 900° C. to about 1200° C. to produce a nanocrystalline-Si/$SiO_2$ composite containing silicon nanoparticles.

2. The method according to claim 1, wherein reductive thermal conditions include the presence of an inert gas.

3. The method according to claim 2, wherein the inert gas is selected from helium, argon, nitrogen, and mixtures thereof.

4. The method according to claim 3, wherein the inert gas is nitrogen.

5. The method according to claim 4, wherein the gas comprises about 2% to about 6% hydrogen and about 94% to about 98% nitrogen.

6. A method for preparing photoluminescent silicon nanoparticles comprising acid etching a nanocrystalline-Si/$SiO_2$ composite prepared using the method according to claim 1 under conditions effective to produce photoluminescent silicon nanoparticles.

7. The method according to claim 6, wherein the acid is hydrofluoric acid, nitric acid or mixtures thereof.

8. The method according to claim 7, wherein the acid is hydrofluoric acid.

9. The method according to claim 6, wherein the conditions effective to produce photoluminescent silicon nanoparticles include treating the nanocrystalline-Si/$SiO_2$ composites with acid for about 2 minutes to about 30 minutes, at temperatures in the range of about 20-30° C.

10. A method for preparing a nanocrystalline-Si/$SiO_2$ composite film comprising:
    (a) forming a film comprising hydrogen silsesquioxane (HSQ) on a substrate; and
    (b) curing the film under reductive thermal conditions in the presence of a gas containing hydrogen for about 30 minutes to about 2 hours and at a temperature in the range of about 900° C. to about 1200° C. to produce a nanocrystalline-Si/$SiO_2$ composite film containing silicon nanoparticles.

11. The method according to claim 10, wherein the HSQ film is formed on the substrate by spin coating a solution comprising HSQ onto the substrate.

12. The method according to claim 11 wherein about 0.1 ml to about 1.0 ml of the HSQ solution is deposited onto the substrate and the substrate is spun at about 0 to about 7500 rpm, in about 3 seconds to about 10 seconds.

13. The method according to claim 11, wherein the HSQ solution comprises HSQ and a carrier solvent.

14. The method according to claim 13, wherein the solution comprises about 5% to about 20% HSQ in methyl isobutyl ketone.

15. The method according to claim 10, wherein the substrate is optical grade silica.

16. The method according to claim 10, wherein the film is formed on the substrate in an inert environment.

17. The method according to claim 10, wherein the reductive thermal conditions comprise the presence of an inert gas.

18. The method according to claim 17, wherein the inert gas is selected from helium, argon, nitrogen, and mixtures thereof.

19. The method according to claim 18, wherein the inert gas is nitrogen.

20. The method according to claim 19, wherein the gas comprises about 2% to about 6% hydrogen and about 94% to about 98% nitrogen.

* * * * *